United States Patent [19]

Miesterfeld

[11] 3,999,148
[45] Dec. 21, 1976

[54] OSCILLATOR CIRCUIT

[75] Inventor: Frederick Otto Richard Miesterfeld, Troy, Mich.

[73] Assignee: Chrysler Corporation, Highland Park, Mich.

[22] Filed: Sept. 22, 1975

[21] Appl. No.: 615,438

Related U.S. Application Data

[62] Division of Ser. No. 520,581, Nov. 4, 1974.

[52] U.S. Cl. .......................... 331/143; 331/108 D; 331/113 R
[51] Int. Cl.² ......................................... H03K 3/08
[58] Field of Search ........... 331/111, 108 C, 108 D, 331/143, 113

[56] References Cited
UNITED STATES PATENTS

| | | | |
|---|---|---|---|
| 3,618,131 | 11/1971 | Garde | 331/111 |
| 3,702,446 | 11/1972 | Steudel | 331/111 |
| 3,725,681 | 4/1973 | Frederiksen | 331/111 |

OTHER PUBLICATIONS

RCA Tech Note 936, Sept. 6, 1973, "Two Pin RC Osc.," J. P. Paradise, 3 pp.
Electronic Applications, vol. 29, No. 4, "Wide Range MV," F. May, pp. 125–128.

*Primary Examiner*—John Kominski
*Attorney, Agent, or Firm*—Talburtt & Baldwin

[57] ABSTRACT

A fluid level sensor comprising a novel electronic circuit which monitors change in the fluid level in a reservoir through a conductive probe disposed therein. The probe and a capacitor are electrically connected in a circuit which is intermittently energized to create an electrical transient therein. The transient is monitored, and a warning is given when the transient indicates that the probe is not in contact with the fluid in the reservoir. Two embodiments are disclosed as applied to a vehicle hydraulic brake system having a dual reservoir type master brake cylinder with a probe for each reservoir. In one, only a single capacitor is required since the electronic circuit electrically connects each probe with the capacitor sequentially by means of time multiplexing. In the other, a capacitor is required for each probe and the transients in each capacitor/probe circuit are fed to a logic circuit which determines if any of the probes is out of contact with the fluid in the reservoir. The electronic circuit is especially adapted for fabrication as an integrated circuit chip using C-Mos technology. With such a circuit chip a minimum number of terminals are required to connect external components to the chip for performing the fluid level sensing function.

3 Claims, 4 Drawing Figures

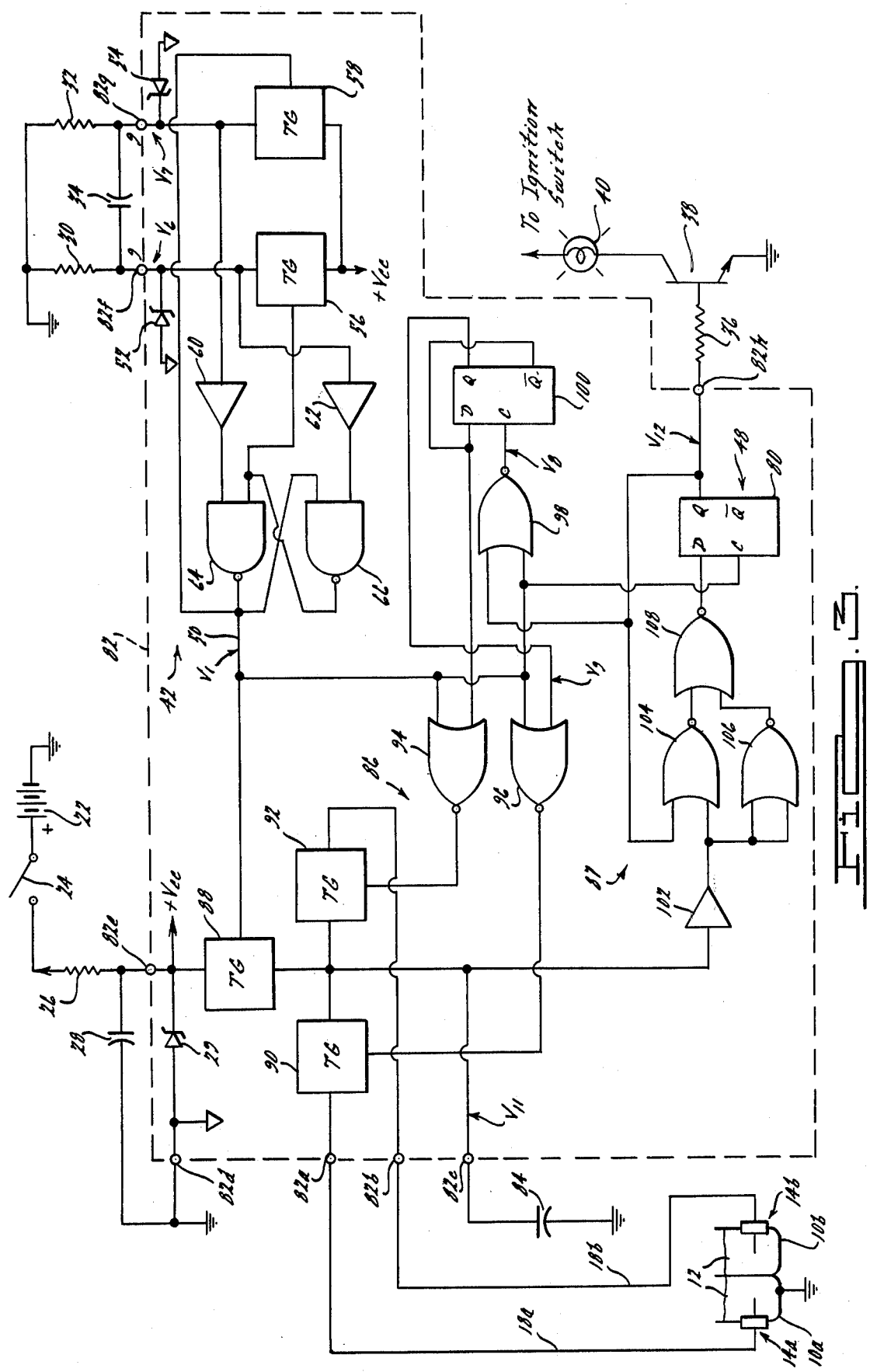

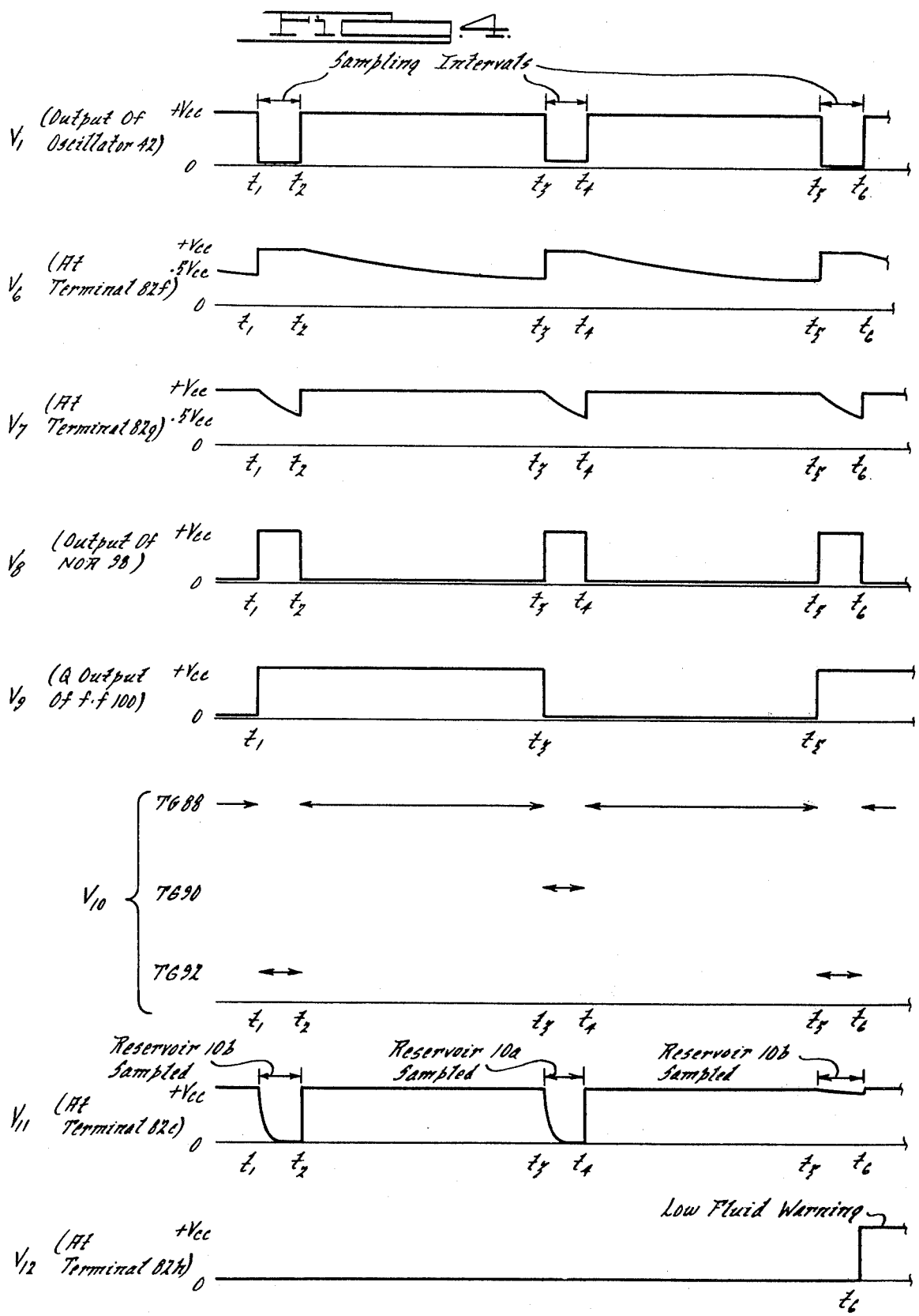

OSCILLATOR CIRCUIT

This is a division of application Ser. No. 520,581 filed Nov. 4, 1974.

BACKGROUND AND SUMMARY OF THE INVENTION

The present invention pertains to a novel oscillator circuit useful in many applications including sensors for sensing change in the amount of fluent material in a reservoir and, in particular, relates to an on-off type oscillator wherein the on time is a function of the RC time constant of a capacitor and a resistor and the off time is a function of the RC time constant of said capacitor and a second resistor.

The prior art contains several types of fluid level sensors which provide a warning when the level of fluid in a reservoir drops below a predetermined level. In one type, a conductive probe is inserted into the reservoir, and electrical current is continuously conducted from the probe through electrically conductive fluid in the reservoir to ground. So long as the probe remains in contact with the fluid, a circuit is completed between the probe and ground, but when the fluid level drops to a point where the probe is no longer in contact with the fluid, then the circuit is opened. Appropriate circuitry can monitor the diminution of current through the probe to provide a warning signal indicating that the fluid level in the reservoir has dropped below a predetermined level.

Another type of prior fluid level sensor incorporates a temperature responsive device, such as thermistor, which is disposed within the reservoir at a given level and connected in an electric circuit. Current is continuously passed through the thermistor, and so long as it remains immersed in fluid a certain amount of heat is dissipated through the fluid in the reservoir. Should the thermistor come out of the fluid then the heat transfer characteristics change to create a corresponding change in current flow through the thermistor which can be detected to provide a warning that the fluid level has dropped below the desired level.

Still another type of prior fluid level sensor continuously subjects a probe to an alternating current.

A common disadvantage of all these prior sensors is that they require a continuous current draw by the sensing element so long as they are operational.

The present disclosure is directed toward a novel fluid level sensor which overcomes the above discussed disadvantage of prior fluid level sensors by novel circuitry wherein the sensing element requires only intermittent current draw. The sensor, rather than subjecting the sensing element to a continuous current draw, connects the sensing element in circuit with a capacitor thereby forming an RC circuit, then subjects this RC circuit to a transient condition, and finally monitors the transient response of the RC circuit. Where the sensing element is a conductive probe in contact with the electrically conductive fluid, such as conductive hydraulic brake fluid, the time constant of the RC circuit is such that the transient condition has a comparatively short time constant relative to the time constant which the circuit exhibits when the probe is not in contact with the fluid. The circuit monitors the nature of the transient response and provides a warning signal when the transient response is indicative of the probe being out of contact with the fluid. Where more than one reservoir is to be monitored, one embodiment disclosed herein provides a novel arrangement whereby a single capacitor is time multiplexed with the probes in the reservoirs. The other embodiment disclosed herein requires a capacitor for each probe and simultaneously subjects each capacitor/probe circuit to a transient condition at given sampling intervals. In thus subjecting each probe to an intermittent duty cycle type of operation, each embodiment includes an oscillator section which is believed novel by itself. The oscillator section establishes the duration of the sampling interval during which the fluid level in each reservoir is sampled and also the duration between successive sampling intervals. In the multiplex system, the oscillator section, in addition to establishing the duration of the sampling interval, is used in conjunction with additional circuitry to provide multiplexing. The invention is especially adapted for fabrication as a single, integrated circuit chip using C-Mos technology. In this regard, the invention provides a circuit capable of accomplishing its function with a comparatively small number of terminals being required to connect external components to the circuit chip. This is important in minimizing the cost of the system as well as contributing to the system reliability. By using C-Mos technology, the invention is particularly adapted for automotive application wherein only a single-ended power supply is available and the available electrical voltage may fluctuate over a considerable range.

The foregoing features and advantages of the invention, along with additional ones, will be seen in the ensuing description and claims which are to be taken in conjunction with the accompanying drawings.

BRIEF DESCRIPTION OF THE DRAWINGS

The drawings illustrate a preferred embodiment of the present invention according to the best mode presently contemplated in carrying out the invention.

FIG. 3 is a schematic circuit diagram of a second species of fluid level sensor embodying the present invention.

FIG. 4 is a timing diagram illustrating several electrical waveforms useful in explaining the operation of the circuit of FIG. 3.

DESCRIPTION OF THE PREFERRED EMBODIMENTS

Figure 1:
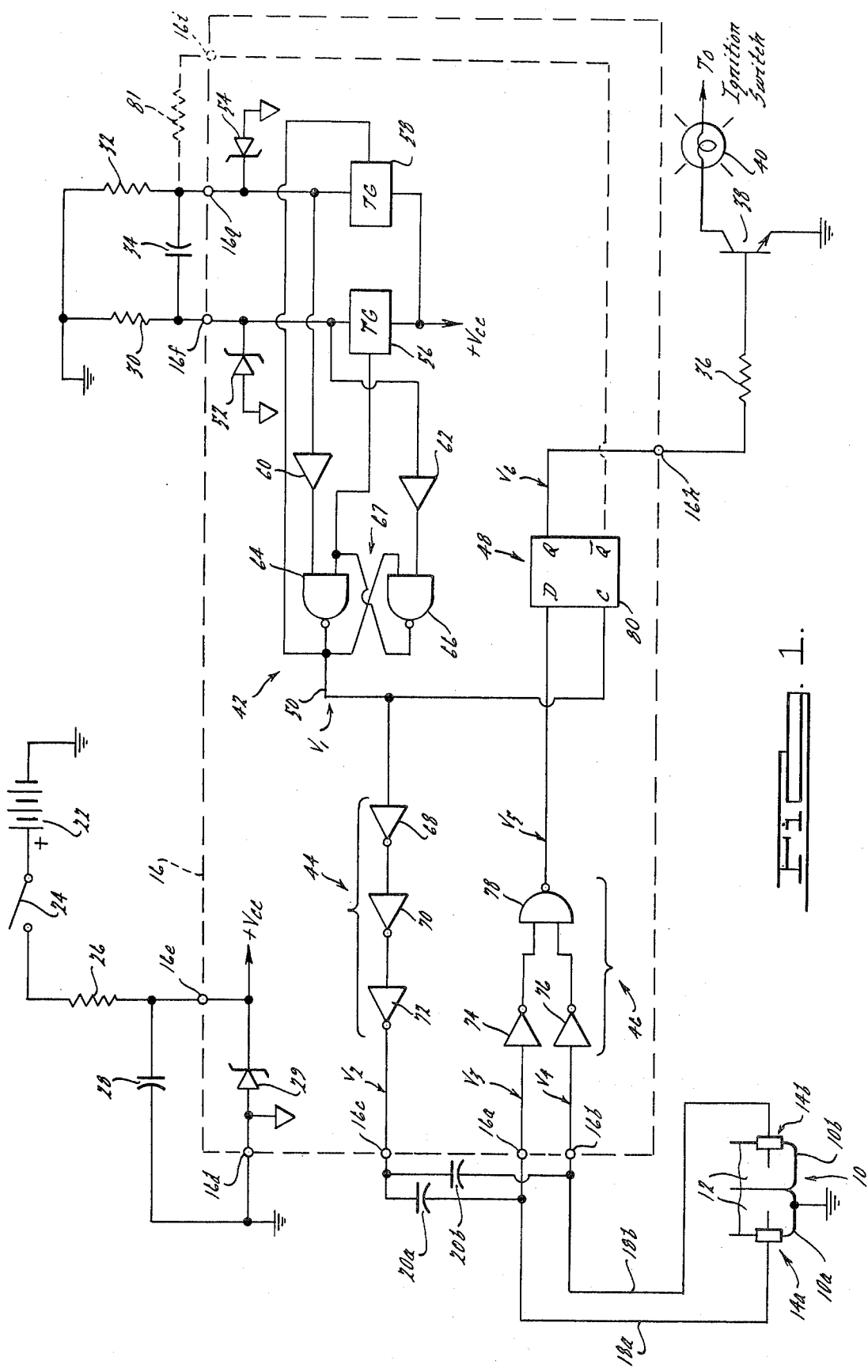
FIG. 1 is a schematic circuit diagram of a first species of fluid level sensor embodying the present invention.

Turning first to FIG. 1, there is shown a first species of fluid level sensor embodying the present invention which monitors the fluid level in each of a pair of reservoirs 10a, 10b of a dual reservoir master brake cylinder 10 of the type commonly used on automotive vehicles having split hydraulic brake systems. The reservoirs are connected to a point of fixed electrical potential forming a reference ground, and each reservoir is filled to a given fill level with electrically conductive hydraulic brake fluid 12. A fluid level sensing element is disposed in each reservoir somewhat below the given fill level. As shown in the drawing, an electrically conductive probe assembly 14a mounts on reservoir 10a while a similar probe 14b mounts on reservoir 10b. Probe assemblies 14a and 14b are conventional, and each includes a fitting which mounts the probe in the side wall of its reservoir and a tip which projects into the reservoir. The fitting serves to mount the probe within the reservoir as well as to close and seal the opening into which it is inserted so that fluid does not leak out. Further, the probe tip is insulated from the fitting and the tip is electrically connected by means of a lead wire with the electronic fluid level sensing circuitry. Spo long as the fluid level in each reservoir remains above the level of the probe, the probe is at least partially immersed in the fluid and thereby a circuit is completed from the probe tip through the fluid to the grounded reservoir. Typically, this circuit has an impedance of appreciable magnitude; however, as the fluid level drops below the level of the probe, the impedance increases substantially so that there is essentially an open circuit from the probe to ground when the probe tip is no longer in contact with the fluid.

The remainder of FIG. 1 constitutes circuitry which is operatively associated with the probes, and this circuitry contains a number of electronic components. Those components which are shown within the confines of the broken line 16 are intended for fabrication using known C-Mos technology as a single integrated circuit chip although it will be appreciated that the invention can be practiced using discrete components if desired. Therefore, the circuit chip defined by the broken line 16 is shown to include a number of terminals via which various external circuit components are connected thereto. These terminals are designated 16a, 16b, 16c, 16d, 16e, 16f, 16g and 16h. The lead wire 18a from probe assembly 14a connects to terminal 16a and the lead wire 18b from probe assembly 14b connects to terminal 16b. A pair of capacitors 20a and 20b are electrically connected with probes 14a and 14b respectively by connecting capacitor 20a between terminals 16a and 16c and by connecting capacitor 20b between terminals 16b and 16c. As will become apparent hereinafter, capacitor 20a and probe 14a form an input circuit which is operatively associated with reservoir 10a, and capacitor 20b and probe 14b, an input circuit which is operatively associated with reservoir 10b. Power for the circuit is preferably supplied from the existing vehicle battery 22 through the run contact 24 of the existing ignition switch. An input filter is connected between switch contact 24 and the power input terminals 16d, 16e for circuit chip 16. This filter circuit consists of a resistor 26 which connects directly from the load side of switch contact 24 to terminal 16e and a capacitor 28 which connects between terminals 16e and 16d, the latter terminal also being connected to ground. A zener diode 29 is connected between terminals 16d and 16e to provide a regulated potential of $+V_{cc}$ relative to ground, and alternatively the zener diode could be located externally of chip 16 if desired.

The duty cycle of the fluid level sensor is established in part by means of two resistors 30 and 32 and a capacitor 34 which are connected to terminals 16f and 16g. As shown, resistor 30 connects between terminal 16f and ground, resistor 32 between terminal 16g and ground, and capacitor 34 between terminals 16f and 16g. A warning output indicative of a loss of fluid in one of the reservoirs is given via the circuit connected to terminal 16h which includes a resistor 36, a transistor 38, and an indicating lamp 40. As shown, resistor 36 connects directly from terminal 16h to the base of transistor 38, the emitter of transmitter 38 is grounded, and the collector of transistor 38 connects through lamp 40 to the load side of ignition switch contact 24.

Figure 2:
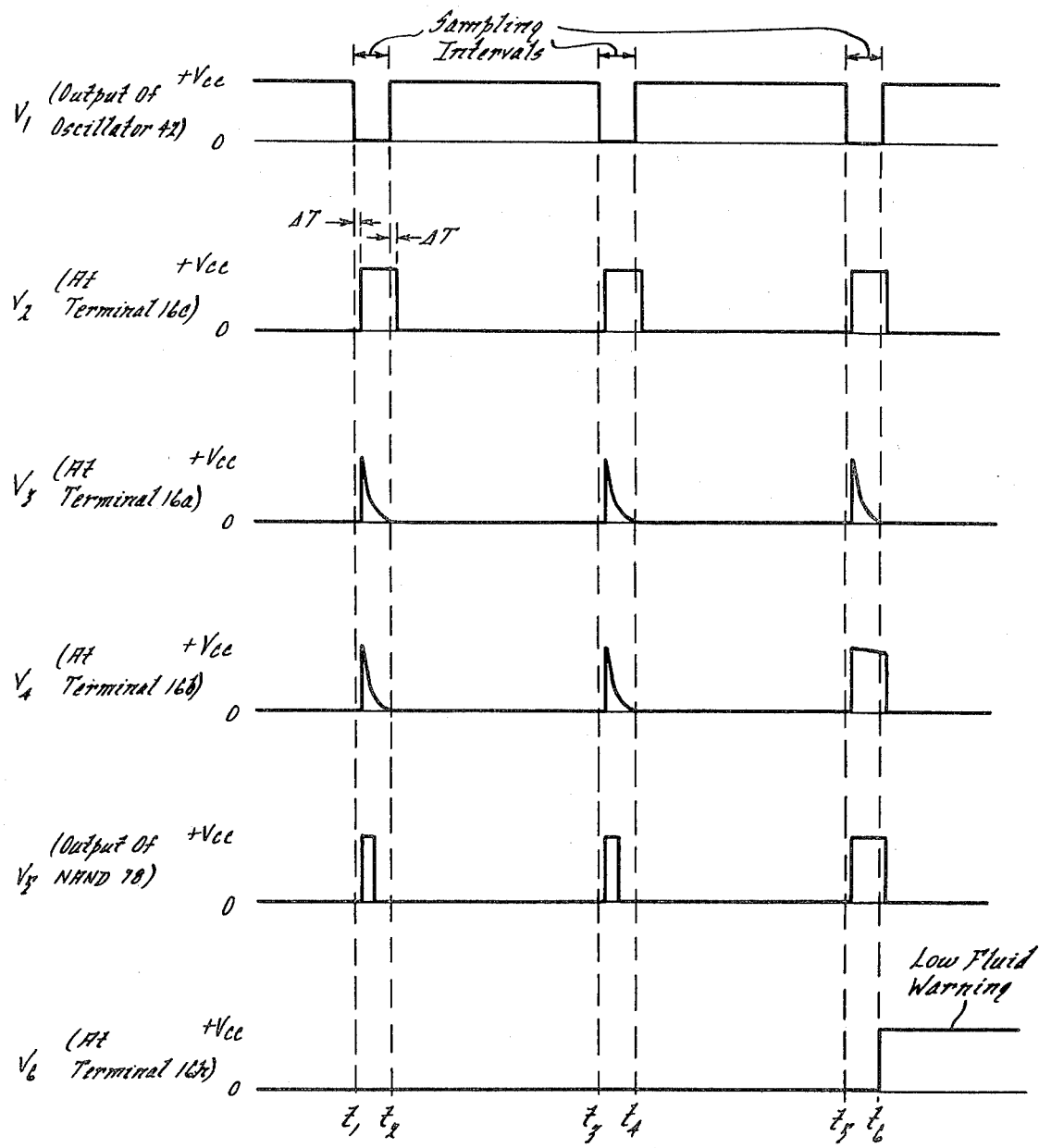
FIG. 2 is a timing diagram of several electrical waveforms useful in explaining the operation of the circuit of FIG. 1.

Circuit 16 contains an oscillator circuit section 42, a delay circuit section 44, a logic circuit section 46, and a memory circuit section 48. Oscillator section 42 when considered in conjunction with resistors 30 and 32 and capacitor 34 generates a timing signal at line 50 which determines the duty cycle of the circuit. This timing signal is shown by the waveform $V_1$ in FIG. 2. As can be seen, waveform $V_1$ is an on-off (high-low) type waveform which switches back and forth between a potential $+V_{cc}$ and ground. In the ensuing description of the system logic, $+V_{cc}$ will be referred to as "high" and ground as "low". As will become apparent, waveform $V_1$ is periodic with the time interval during which the waveform is at ground (low) being determined by the values of capacitor 34 and resistor 32 and the time interval during which the waveform is at $+V_{cc}$ (high) being determined by the values of capacitor 34 and resistor 30. Oscillator section 42 is constructed from known electronic components which include a pair of zener diodes 52, 54; a pair of transmission gates 56, 58; a pair of amplifiers 60, 62; and a pair of dual input NAND gates 64 and 66. NAND gates 64, 66 are interconnected to form a flip-flop 67. Zener diode 52 is connected between terminal 16f and ground to limit the voltage at terminal 16f to the zener level of zener diode 52. Similarly, zener diode 54 is connected between terminal 16g and ground to limit the voltage at terminal 16g to its zener level. Each transmission gate is a three-terminal device having a control terminal which controls current transmission through the device between the two other terminals. Hence, each transmission gate is essentially an electronic switch which may be either opened or closed depending on the condition of the signal applied to its control terminal. Transmission gate 56 has its control terminal connected to the output of NAND gate 66 while transmission gate 58 has its control terminal connected to the output of NAND gate 64. Transmission gate 56 is connected so that its controlled current transmission path is between $+V_{cc}$ and terminal 16f while transmission gate 58 is connected so that its controlled current transmission path is between $+V_{cc}$ and terminal 16g. The amplifier 60 has its input connected to terminal 16g and its output to the set input of the flip-flop 67 at NAND gate 64. Similarly, amplifier 62 has its input connected to terminal 16f and its output to the reset input of flip-flop 67 at NAND gate 66. Oscillator section 42 develops a self-sustaining on-off (or high-low) type oscillation when ignition switch 24 is closed to supply power to the circuit. As noted, the waveform $V_1$ in FIG. 2 represents the waveform appearing at line 50 with the oscillator operating in the steady-state condition. The waveform may be considered as a pulse train consisting of rectangular negative-going pulses (relative to high) which define sampling intervals. Since both oscillator stages in the two embodiments of FIGS. 1 and 3 are identical, detailed discussion of the oscillator stage will be deferred until the description of FIG. 3 which will be explained in conjunction with waveforms $V_6$ and $V_7$ shown in FIG. 4.

Line 50 connects the output $V_1$ of oscillator 42 to both delay section 44 and to memory section 48. Considering first delay section 44, it can be seen that delay section 44 comprises three inverters 68, 70 and 72 which are cascaded together from line 50 to terminal 16c. Hence, the waveform appearing at terminal 16c is the inverse of waveform $V_1$ but is delayed slightly in time due to the transit delay in passing through the three inverters. The waveform appearing at terminal 16c is shown by waveform $V_2$ in FIG. 2 wherein each positive-going pulse of waveform $V_2$ is shifted in time by an amount $\Delta T$ relative to the corresponding negative-going pulse of waveform $V_1$. Each pulse appearing at terminal 16c serves to simultaneously create an electrical transient in each of the two capacitor/probe input circuits whereby the RC time constant of each capacitor/probe circuit may be monitored. So long as each probe remains in contact with the conductive fluid in its reservoir, the corresponding capacitor/probe input circuit exhibits a certain RC time constant when pulsed. The RC time constants for both circuits are approximately equal and are of such value in relation to the duration of each positive-going pulse in waveform $V_2$ that a normal transient response such as shown during time intervals $t1-t2$ and $t3-t4$ in waveforms $V_3$ and $V_4$ of FIG. 2 will be obtained. Waveform $V_3$ appears at terminal 16a and waveform $V_4$ at terminal 16b. The normal transient is such that at the conclusion of the positive-going $V_2$ pulse, the signals at terminals 16a and 16b are below a threshold level. However, should one of the probes be out of contact with the fluid in its reservoir, when its circuit is pulsed, then a much larger time constant is exhibited. An example of this is shown by the third pulse in waveform $V_4$ occurring during times $t5-t6$.

Logic circuit 46 monitors the transient response of both capacitor/probe circuits. The illustrated logic circuit 46 comprises a pair of inverters 74,76 and a NAND gate 78 which cooperate to provide a logical OR function. Inverter 74 connects between terminal 16a and one input of NAND gate 78 while inverter 76 connects between terminal 16b and the other input of NAND gate 78. Inverters 74 and 76 provide gain to improve the OR function. The operation of logic circuit 46 is such that its output goes high as soon as a transient is generated in either of the two capacitor/probe input circuits. If both input circuits have their probes in contact with the fluid, the transient dissipates relatively quickly so that the output of NAND gate 78 switches low well before the termination of the positive-going input pulse of waveform $V_2$ which created the transient. This is shown by the first two pulses in waveform $V_5$. However, if either probe is out of its fluid, then the output of the logic circuit will still be high when the positive input pulse in waveform $V_2$ terminates such as shown by the third pulse in waveform $V_5$. Memory circuit 48 responds to this condition to indicate that the fluid level in one of the reservoirs has dropped below its desired level.

Memory circuit 48 comprises a single D-type flip-flop 80 which has its D input connected directly to the output of NAND gate 78 and its C input connected to line 50. The Q output of flip-flop 80 connects to terminal 16h. From consideration of waveform $V_1$, it will be observed that the positive-going edge at the termination of each pulse provides a clock input to the C terminal of flip-flop 80. So long as a low signal is present at the D input of flip-flop 80, the cyclical clocking of the flip-flop clocks the low through to the Q output terminal. However, if a high signal is present at the D input of flip-flop 80 at the instant of clocking, then the high is clocked through to the Q output. A high at the Q output of the flip-flop will create base current in transistor 38 to switch the transistor into conduction and thereby energize the warning lamp 40. The warning lamp is positioned in the vehicle within the view of the operator so that the operator is thereby warned of a lower brake fluid level in either one of the reservoirs. The waveform $V_6$ in FIG. 2 illustrates the output of flip-flop 80 as taken at terminal 16h.

If desired, the sensor may be provided with a certain switching hysteresis. One way of accomplishing this is by connecting a resistor 81 externally of chip 16 between the $\overline{Q}$ output of flip-flop 80 and terminal 16g. This requires an extra terminal 16i for chip 16. The provision of resistor 81 modifies the RC time constant of resistor 32 and capacitor 34 when flip-flop 80 has its Q output high and its $\overline{Q}$ output low so that once a warning is given, the duration of the sampling interval is shortened slightly. Such hysteresis tends to minimize flickering of the warning lamp when the fluid level in a reservoir just begins to drop below the predetermined level established by its probe.

It will be observed that the fluid level sensor operates in such a manner that continued loss of contact between the probe and the fluid is essential to maintain lamp 40 energized. Should a condition exist where the fluid level in one of the reservoirs is such that due to sloshing of the fluid the probe may at times lose contact with the fluid, then the warning lamp will light intermittently. If the level is further depleted, the lamp will light more frequently until a point is reached the lamp will tend to remain on continuously. Hence, the fluid level sensor has the advantage of providing to some degree an indication of the severity of the loss of fluid in a reservoir.

The embodiment of FIG. 3 is in many respects similar to the embodiment of FIG. 1; however, there are some notable differences both in construction and operation. Like components in both figures are identified by like numerals. In FIG. 3, the circuit chip is designated by the numeral 82. Like circuit 16, circuit 82 contains eight input terminals designated 82a, 82b, 82c, 82d, 82e, 82f, 82g, and 82h. Probes 14a and 14b connect to terminals 82a and 82b respectively. Power is supplied to terminals 82e and 82d. Resistors 30 and 32 and capacitor 34 connect to terminals 82f and 82g and resistor 36 connects to terminal 82h. Unlike the circuit of FIG. 1 which requires a capacitor for each input circuit, the circuit of FIG. 3 requires only a single capacitor 84 which connects between terminal 82c and ground. Like circuit 16, circuit 82 contains an oscillator section 42 and a memory section 48. However, unlike circuit 16, circuit 82 incorporates a multiplex circuit 86 and a hysteresis circuit 87 in place of delay circuit 44 and logic circuit 46.

Multiplex circuit 86 includes a set of three transmission gates 88, 90 and 92; a set of three dual input NOR gates 94, 96, 98; and D-type flip-flop 100. Transmission gate 88 is connected such that its controlled current transmission path is between terminals 82c and 82e; transmission gate 90, so that its controlled current transmission path is between terminals 82c and 82a; and transmission gate 92, so that its controlled current transmission is between terminals 82c and 82b. The control terminal of transmission gate 88 connects by line 50 to the output of NAND gate 64; the control terminal of transmission gate 90 connects to the output of NOR gate 96; and the control terminal of transmission gate 92 to the output of NOR gate 94. Each NOR gate 94, 96 and 98, has one of its two inputs connected via line 50 to the output of NAND gate 64. The other input of NOR gate 94 is connected to the $\overline{Q}$ output of flip-flop 100 while the other input of NOR gate 96 is connected to the Q output of flip-flop 100. The other input of NOR gate 98 is connected to the Q output of flip-flop 80. The output of NOR gate 98 connects to the C input of flip-flop 100 and the D input of flip-flop 100 connects to its own $\overline{Q}$ output.

Multiplex circuit 86 operates as follows. So long as both probes 14a and 14b remain in contact with the fluid in their reservoirs, the output signal at the Q output of flip-flop 80 remains low. Therefore, under this condition, signals are applied by NOR gate 98 to the C input of flip-flop 100 in accordance with the output waveform $V_1$ of oscillator section 42. The waveform $V_8$ in FIG. 4 represents the output waveform appearing at the output of NOR gate 98. The waveform $V_9$ in FIG. 4 represents the output waveform appearing at the Q output of flip-flop 100. As can be seen by comparison of the waveforms $V_1$, $V_8$, and $V_9$, flip-flop 100 is clocked in response to the leading (i.e. negative-going) edge of each sampling interval pulse of the $V_1$ waveform, NOR gate 98 serving to invert waveform $V_1$ to apply a suitable clocking signal to flip-flop 100. By connecting NOR gate 94 to the Q output of flip-flop 100 and NOR gate 96 to the $\overline{Q}$ output, the two NOR gates are alternately gated. Specifically, each NOR gate is gated by applying a low gating signal from flip-flop 100, and, therefore, NOR gate 96 is gated when waveform $V_9$ is high. When each NOR gate 94, 96 is gated, the output thereof is the inverse of waveform $V_1$. Hence, transmission gates 90 and 92 alternately transmit as indicated by the timing relationship shown at $V_{10}$ in FIG. 4 wherein a solid line indicates transmission of the corresponding transmission gate. By connecting transmission gate 88 to the output of oscillator 42, transmission gate 88 transmits during the interval between sampling pulses of waveform $V_1$.

In light of the operating description of multiplex circuit 86, it can now be seen how the fluid level in each reservoir 10a and 10b is alternately monitored. During the time prior to time $t_1$, transmission gate 88 is transmitting while transmission gates 90 and 92 are not transmitting. Therefore, capacitor 84 is charged to $+V_{cc}$. At time $t_1$, transmission gate 88 ceases transmitting and transmission gate 92 beings transmitting. Therefore, at this instant, capacitor 84 is connected to discharge through probe 14b. So long as probe 14b is in contact with fluid in its reservoir, the circuit exhibits an RC time constant which will reduce the capacitor voltage below a given level within a given time. A typical response is shown by waveform $V_{11}$ during the interval between times $t_1$ and $t_2$. So long as the capacitor voltage has dropped to a level below a certain threshold by time $t_2$, the clock pulse applied at time $t_2$ to flip-flop 80 clocks a low signal to the flip-flop Q output and no warning is given. This indicates the continued existence of adequate fluid level in reservoir 10b. At time $t_2$, transmission gate 92 ceases transmission while transmission gate 88 commences transmission. Capacitor 84 is again charged to $+V_{cc}$ to await the next sampling interval which begins at time $t_3$. When time $t_3$ arrives transmission gate 88 ceases transmission and a high is clocked to the Q output of flip-flop 100. Flip-flop 100 now gates NOR gate 96 which immediately causes transmission gate 90 to transmit. Capacitor 84 is thus connected for discharge through probe 14a to sample the fluid level in reservoir 10a during the interval $t_3$–$t_4$. If a satisfactory level exists, waveform $V_{11}$ will exhibit a response like that shown between time $t_3$ and $t_4$ and flip-flop 100 will clock a low signal to its Q output at time $t_4$. Should probe 14b lose contact with the fluid in its reservoir the response will be as shown by waveform $V_{11}$ during the time interval $t_5$–$t_6$. Because probe 14b is out of contact with the fluid in its reservoir during the time $t_5$–$t_6$, the charge on capacitor 84 does not drop below the threshold level when flip-flop 80 is clocked at the end of the sampling interval. This will cause flip-flop 80 to clock through a high to its Q output at time $t_6$ as shown by waveform $V_{12}$ in FIG. 4. With the Q output of flip-flop 80 high, lamp 40 lights.

Capacitor 84 is coupled to the D input of flip-flop 80 by means of the hysteresis circuit 87 consisting of an amplifier 102 and a set of three NOR gates 104, 106 and 108 which are connected as illustrated. Hysteresis circuit 87 provides a certain switching hysteresis for the sensor as did resistor 81 for the embodiment of FIG. 1. However, hysteresis circuit 87 has the advantage of being contained on chip 82. Circuit 87 operates to slightly reduce the threshold level of capacitor voltage at which a high signal will be clocked through flip-flop 80. When a low is present at the Q output of flip-flop 80, a certain threshold is established by the NOR gate input/output characteristics and when a high is present at the Q output of flip 80, the threshold is reduced slightly. It should be noted that the hysteresis circuits of each embodiment are interchangeable.

Attention is now directed to further consideration of oscillator section 42 which is believed novel by itself. An important advantage of oscillator 42 is that it requires only two terminals pins, namely, terminals 82f, 82g, via which the resistors 30 and 32 and the capacitor 34 are connected with the electronic logic circuitry to provide control of the duration of the sampling intervals and also of the duration between sampling intervals. The operation of oscillator section 42 may be best understood with reference to waveforms $V_1$ and $V_6$ and $V_7$ of FIG. 4. These waveforms illustrate the steady state operation of oscillator 42. When power is applied to the circuit, oscillator 42 will develop a self-sustaining oscillation. This oscillation is developed by successively charging capacitor 34 in opposite directions alternately through resistors 30 and 32. Capacitor 34 is charged in one direction through resistor 30 during the time intervals between sampling intervals while capacitor 34 is charged in the opposite direction through resistor 32 during the sampling intervals.

In describing the operation of oscillator section 42 let it be assumed that the description begins just prior to the time $t_1$. Just prior to $t_1$, a high signal is present at the output of NAND gate 64 and a low signal at the output of NAND gate 66. The high output signal of NAND gate 64 enables transmission gate 58 to transmit whereas the low output signal from NAND gate 66 prevents transmission gate 56 from transmitting. The voltage at terminal 82g is at $+V_{cc}$. The voltage at terminal 82f is approaching $+0.5V_{cc}$ which is the nominal threshold level of amplifier 62. When the voltage at terminal 82f reaches the $+0.5V_{cc}$ threshold of amplifier 62, a low input signal is applied to the reset input of flip-flop 67 at NAND gate 66. This immediately causes the flip-flop to be reset so that the signal at the output of NAND gate 64 becomes low while the output signal at the output of NAND gate 66 goes high. In response to the change of state of the flip-flop, transmission gate 58 ceases transmission whereas transmission 56 commences transmission. At this instant, a voltage exists across capacitor 34 of approximately $+0.5V_{cc}$ with the capacitor terminal connected to terminal 82g being positive with respect to the capacitor terminal connected to terminal 82f. Both the zener diodes 52 and 54 are selected to have a zener level substantially equal to the level of $+V_{cc}$. Therefore, in response to the change in transmission of the two transmission gates 56, 58, the charge on capacitor 34 is quickly dissipated through zener diode 54 with the potential at terminal 82g being limited to the zener level by zener diode 54. With essentially zero volts now across capacitor 34 and with transmission gate 56 transmitting, the voltage across capacitor 34 increases exponentially toward a value equal to $+V_{cc}$, the current flowing through resistor 32. The voltage at terminal 82f remains at $+V_{cc}$ while the voltage at terminal 82g begins to discharge along an exponential curve toward ground. The time constant of the exponential discharge is determined by the value of capacitor 34 and the value of resistor 32. The discharge is illustrated by the portion of waveform $V_7$ occurring between times $t_1$ and $t_2$ (i.e., during the sampling interval). When the voltage at terminal 82g reaches approximately $+0.5V_{cc}$, the threshold of amplifier 60 is reached. A low input signal is now applied to the set input of flip-flop 67 at NAND gate 64 to cause the flip-flop to change state. In response, transmission gate 56 ceases transmitting while transmission gate 58 commences transmission. Since there is a charge across capacitor 34 of approximately $+0.5V_{cc}$ with the terminal thereof connected to terminal 82f being positive with respect to the terminal thereof connected to terminal 82g, zener diode 52 rapidly dissipates the charge on capacitor 34. Now capacitor charges through transmission gate 58 and resistor 30. While capacitor is being charged, the voltage at terminal 82g remains at $+V_{cc}$ while the voltage at terminal 82f decays along an exponential curve toward ground as shown by waveform $V_6$ between times $t_2$ and $t_3$ with a time constant determined by the value of capacitor 34 and resistor 30. This completes one cycle of oscillator stage 42.

As mentioned above, the illustrated circuitry is well-suited for fabrication as a single integrated circuit chip using known C-Mos technology. When so fabricated, the sensor has the advantage of improved accuracy and sensitivity. This is because the various microcircuit elements will have matched characteristics; for example, the zener diodes will be matched to each other; the amplifiers will have the same threshold level; etc. Absolutely no external adjustment nor calibration is required, and the circuit remains accurate over a range of power supply voltages. Therefore, the circuit response is essentially solely a function of the RC time constant of each capacitor/probe circuit, and is especially accurate. The embodiment of FIG. 1 may be used in a system where there are a plurality of reservoirs containing fluids of different electrical characteristics since each capacitor is individual to a given reservoir and may be selected accordingly. The embodiment of FIG. 3 may be used in a system where the reservoirs contain fluids having the same electrical characteristics and eliminates the necessity of having a capacitor for each reservoir. From the foregoing description, it can be seen that there has been disclosed a versatile, reliable and accurate sensor which has a number of potential applications where change in the amount of fluent material in a reservoir is to be sensed, and a novel oscillator circuit which may be used to advantage in this and other applications.

What is claimed as new is:

1. An on-off type oscillator circuit wherein the on time is a function of the RC time constant of a capacitor and a resistor and the off time is a function of the RC time constant of said capacitor and a second resistor, said circuit comprising in combination with said capacitor and said resistors:

a D. C. power supply;
   a transmission gate having its controlled conduction path connecting said first-mentioned resistor across said power supply;
   a second transmission gate having its controlled conduction path connecting said second resistor across said power supply;
   means connecting said capacitor between the junction of said first resistor and of said first transmission gate and the junction of said second resistor and of said second transmission gate;
   limiting means connected at said first-mentioned junction to limit the potential thereof to a predetermined value;
   a second limiting means connected at said second junction to limit the potential thereof to a given value;
   a flip-flop having a pair of inputs and a pair of outputs;
   means connecting one of said flip-flop inputs to said first junction;
   means connecting the other of said flip-flop inputs to said second junction;
   means connecting one of said flip-flop outputs to the control input of said first transmission gate; and
   means connecting the other of said flip-flop outputs to the control input of said second transmission gate.

2. An oscillator circuit as claimed in claim 1 wherein said flip-flop comprises a pair of cross-coupled NAND gates.

3. An oscillator circuit as claimed in claim 1 wherein said first and second limiting means comprise first and second zener diodes whose zener breakdown potential is substantially equal to the potential of said D. C. supply.

* * * * *